United States Patent [19]

Stuckert

[11] 4,066,458
[45] Jan. 3, 1978

[54] MASK-EXPOSURE SCHEME

[75] Inventor: Paul E. Stuckert, Katonah, N.Y.

[73] Assignee: International Business Machines Corporation, Armonk, N.Y.

[21] Appl. No.: 575,859

[22] Filed: May 8, 1975

Related U.S. Application Data

[63] Continuation-in-part of Ser. No. 474,627, May 30, 1974, abandoned.

[51] Int. Cl.² .................. G03C 5/04; G03C 5/06
[52] U.S. Cl. .................................. 96/41; 96/44; 96/27 R; 96/27 E; 250/492 A
[58] Field of Search ............ 250/310, 311, 491, 492, 250/511, 505, 306–311; 178/7.6, 7.82; 96/44, 41, 27 R, 27 E, 36.1

[56] References Cited
U.S. PATENT DOCUMENTS

| 3,888,673 | 6/1975 | Suzuki et al. | 96/36.1 |
| 3,936,302 | 2/1976 | Takami et al. | 96/36.1 |

*Primary Examiner*—Edward C. Kimlin
*Attorney, Agent, or Firm*—Sughrue, Rothwell, Mion, Zinn and Macpeak

[57] ABSTRACT

Exposure images may be synthesized on a radiation responsive surface by causing effective relative motion between a mask and the surface. The mask contains at least two distinct exposure areas, each having a plurality of apertures arranged in different patterns from which at least two different images can be simultaneously synthesized. Radiation is directed through the plurality of apertures in a mask during a given period to expose a plurality of similarly shaped areas on a surface. During a second period electrons are similarly directed through the same mask which has been effectively displaced and a second plurality of contiguous areas are exposed. During third and fourth succeeding periods, third and fourth pluralities of contiguous areas are exposed. Thus, the image in each exposure area is synthesized from a plurality of contiguous four step exposure images which makes it possible to eliminate the "stencil problem" and permit exposure of areas whose length is very much greater than their width.

7 Claims, 12 Drawing Figures

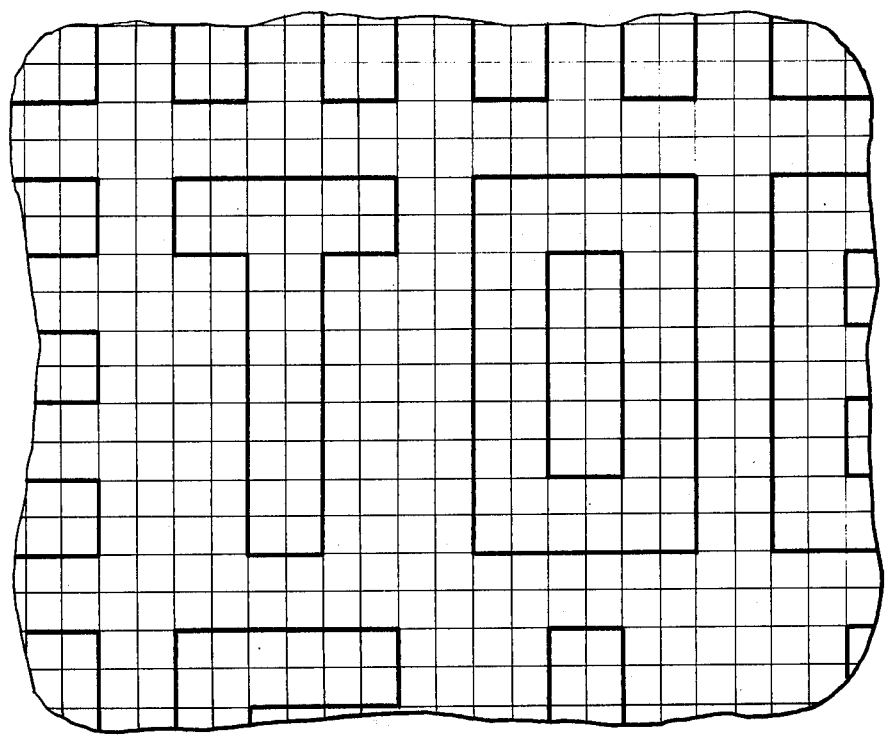
FIG.7a
FIG.7b
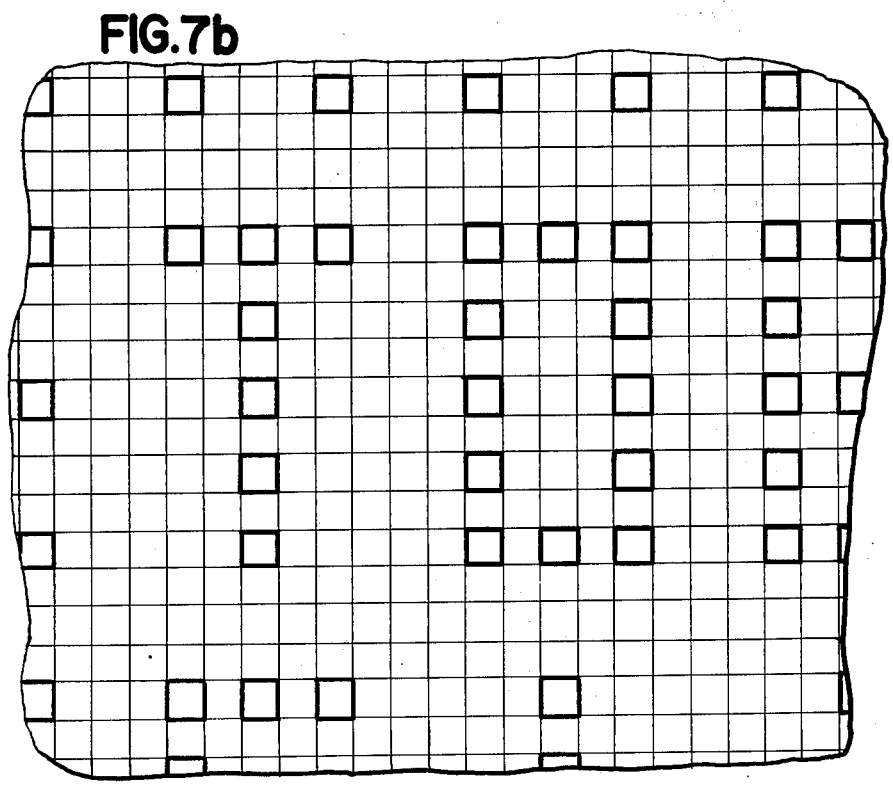

MASK-EXPOSURE SCHEME

CROSS REFERENCE TO RELATED APPLICATION

This application is a continuation-in-part application of Ser. No. 474,627, filed on May 30, 1974, entitled, "Mask-Exposure Scheme", now abandoned.

BACKGROUND OF THE INVENTION

1. Field of the Invention

The present invention is directed broadly to the synthesis of an exposure image on a surface and more specifically to a system wherein electrons are passed through a plurality of apertures in a mask and are subsequently deflected to direct the image of each aperture to four successive contiguous areas on a surface.

2. Prior Art

Projection exposure schemes wherein resists are exposed through masks which project the entire image are known. Also, raster scanning utilizing a single or a plurality of electron beams which are turned on and off to synthesize images on a surface are known. The use of a light table which permits the synthesis of optical images on a photo resist surface is also known. Such a light table may be controlled from a tape to produce the desired image on the photo resist which covers a semiconductor wafer.

U.S. Pat. No. 3,518,083 to Touchy, granted June 30, 1970 and entitled "METHOD AND APPARATUS FOR PRODUCING PHOTOLITHOGRAPHIC STRUCTURES, PARTICULARLY ON SEMICONDUCTOR CRYSTAL SURFACES", discloses an aperture plate containing a plurality of similar apertures through which electrons are directed to form a plurality of identical images. The mask is moved relative to the electron source along a path determined by a stylus which is following an original to produce a plurality of identical images, one per aperture, on a photo resist or the like. There is no disclosure of an exposure scheme whereby a plurality of non-identical images may be synthesized by a four step exposure-deflection of an electron beam through a plurality of rectilinear apertures.

U.S. Pat. No. 3,434,894 to Gale, granted Mar. 25, 1969 and entitled "FABRICATING SOLID STATE DEVICES BY ION IMPLANTATION", discloses a complicated arrangement utilizing a plurality of ion sources in conjunction with an apertured mask and a deflection lens system. Although Gale indicates that an electron beam source can be used with the system and indicates that the potential supply to the deflection system can cause an apparent position of the mask to shift in orthogonal directions, there is no disclosure of synthesizing a rectilinear image by a four step exposure-deflection of a beam passing through one or more rectilinear apertures in a mask.

U.S. Pat. No. 3,736,425 to Chernow provides an adjustable X-Y grid of rods to define a plurality of identical exposure areas but does not disclose an exposure scheme wherein non-identical images may be simultaneously synthesized.

SUMMARY OF THE INVENTION

The present invention provides a mask-exposure scheme which circumvents the "stencil problem", that is, the fabrication of a mask for electron beam projection exposure having an unexposed area which is completely surrounded by an exposed area which, in turn, is completely surrounded by an unexposed area (e.g., like the stencil for an "o") wherein no mask substrate or other supporting means are present.

The present invention provides a mask-exposure scheme which circumvents the mask fabrication, stability and heat dissipation problems associated with dense arrays of long parallel lines, such as memory word and bit lines. Conventional masks for electron beam projection exposure of such arrays would ordinarily have strips of material with impractically large length to width as well as thickness ratios. The present invention provides a mask-exposure scheme wherein an array of elementary rectilinear mask apertures are subjected to a quadruple exposure with the successive mask aperture images being suitably positioned relative to each other by the application of appropriate deflecting signals to electrostatic deflection plates. More specifically, the mask aperture images are deflected in a four step rectilinear pattern so that any rectilinear image may be synthesized by deflecting the images produced by a multiplicity of rectilinear apertures through a four step square pattern.

The present invention provides an exposure scheme wherein at least two non-identical images may be simultaneously synthesized by using a mask having a plurality of identical apertures therethrough.

The foregoing and other objects, features and advantages of the invention will be apparent from the following more particular description of a preferred embodiment of the invention as illustrated in the accompanying drawings.

BRIEF DESCRIPTION OF THE DRAWINGS

FIGS. 7a and 7b show two different images which may be simultaneously synthesized and the mask aperture arrangement for producing the images, respectively.

DETAILED DESCRIPTION OF THE INVENTION

Figure 1:
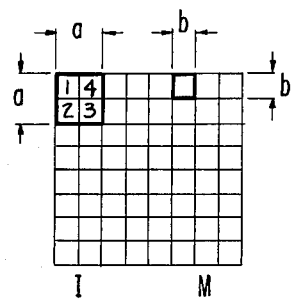
FIG. 1 is a diagrammatic illustration of a single mask aperture and the synthesized image produced thereby according to the present invention.

The present mask-exposure scheme utilizes a source of electrons which are directed toward a mask constructed according to the principles of the present invention. The patent to Hetherington U.S. Pat. No. 3,118,050, granted Jan. 14, 1964 and entitled "Electron Beam Devices and Processes" discloses a suitable electron beam device which is compatible with the maskexposure scheme of the present invention. Hence, it is contemplated that the Hetherington device, with suitable additional control circuitry for deflection and sequencing of multiple exposures, may be employed in practicing this invention. Since the control circuitry is well within the ability of one skilled in the art it is not deemed necessary to illustrate its details.

The present invention utilizes a mask having a plurality of small rectilinear apertures for exposing rectilinear areas. A rectilinear area is a polygon, all of whose sides are parallel to the X and Y axes of a Cartesian coordinate system. Although an entire mask is not illustrated, the apertures are shown in the drawings on an enlarged scale in the proper relation to each other for providing examplary synthesized images. In FIGS. 1–5 inclusive, each Figure is in two parts, wherein the part designated I is the desired exposure image and the part designated M is the mask aperture configuration which produces I. For convenience, both I and M are shown positioned in a rectilinear grid system, it being understood that the location of I and M congruent with the elementary areas of such a grid system is not required. Also, for convenience, I and M are shown for a 1x projection system.

FIG. 1 shows an image I having a minimum exposure area ($a \times a$) and a mask M having a minimum mask aperture ($b \times b$) wherein a equals $2b$ and the image is produced by four successive exposures of the image of the mask aperture in the positions indicated at 1, 2, 3 and 4. If the image in position 1 is the first, or reference, exposure position:

a. the image in position 2 is reached by deflecting the image a distance equal to $-b$ in the Y direction, b. the image in position 3 is reached by deflecting the image distances equal to $-b$ in the Y direction and $+b$ in the X direction, and c. the image in position 4 is reached by deflecting the image a distance equal to $+b$ in the X direction, wherein all deflections specified are relative to position 1, the first, or reference, position.

It is understood that the deflection sequence described immediately above, or an equivalent sequence, and the deflection distances $\pm b$ apply throughout the description of the present invention.

Figure 2:
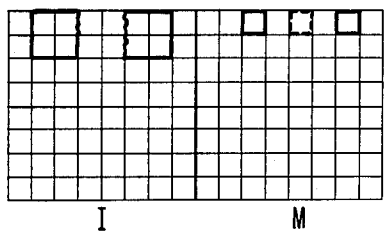
FIG. 2 is a diagrammatic illustration of a mask aperture arrangement according to the present invention and the synthesized image of a line of indefinite length and minimum width produced thereby.

FIG. 2 shows an image and a mask for a line of minimum width and length $na$ ($n$=integer). The dashed aperture shown in the mask can be replaced with any integral number of similar apertures. As a result, the mask will be line of $n$ apertures regardless of the length. This is in contrast to the single long aperture which would be present in a conventional mask.

Figure 3:
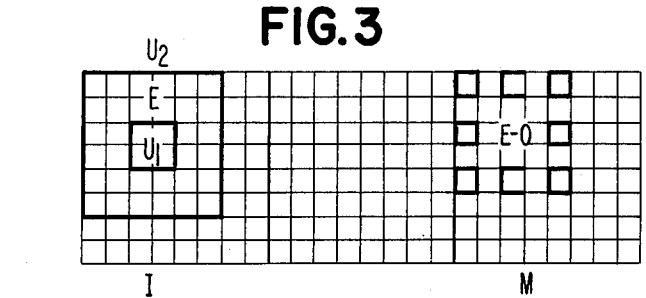
FIG. 3 is a diagrammatic illustration of a mask aperture arrangement according to the present invention and the synthesized image produced thereby which has an isolated unexposed area.

FIG. 3 shows an exposure image having an unexposed area $U_1$ which is completely surrounded by an exposed area E which in turn is surrounded by an unexposed area $U_2$. The mask for producing such an image utilizes eight identical rectilinear apertures positioned as shown in M. Therefore, regardless of the size and relative dimensions of the central unexposed area and the exposed area beyond the minimum dimensions shown in this Figure, the central electron opaque area E-O of the mask is uniformly supported around its periphery and uniformly provided with electric current and heat conducting paths.

Figure 4:
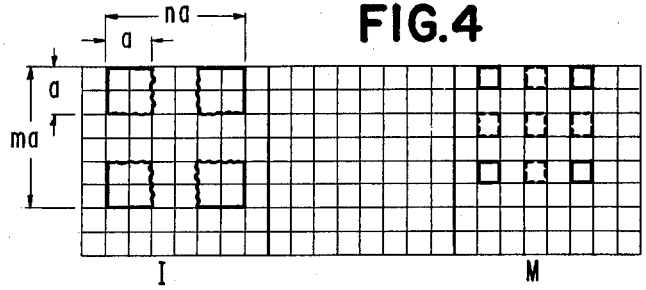
FIG. 4 is a diagrammatic illustration of a mask aperture arrangement according to the present invention and the synthesized image of an area of indefinite length and indefinite width produced thereby.

FIG. 4 shows an exposure image and a mask for a rectangle of dimensions $na \times ma$ since either the dashed row or dashed column of apertures in the mask can be replaced with any integral member of rows or columns of apertures in M.

All mask aperture arrangements described above yield images whose dimensions in X and Y are integral multiples of the minimum exposure area ($a \times a$) in FIG. 1. Here we now consider the dimensions and placement of apertures for the exposure of images whose dimensions in X and Y are not integral multiples of the minimum exposure area.

Assume that a rectilinear image is desired having a dimension L of arbitrary length and that the image is to be synthesized by a four step rectilinear exposure pattern. Since any mask aperture may have a size greater than the minimum size $b \times b$ and since the distance between adjacent mask apertures may have a size less than $b$, since $b = 0.5a$ the following mask aperture design equations result with normalized to unity:

| 1) If $(L - \lfloor L \rfloor) \leq 0.5$ | 2) If $(L - \lfloor L \rfloor) > 0.5$ |
|---|---|
| then: $n = \lfloor L \rfloor$ | then: $n = \lceil L \rceil$ |
| $s = b$ | $d = b$ |
| $d = b + \dfrac{L-n}{n}$ | $s = b + \dfrac{L-n}{n-1}$ |
| $o = d - s$ | $o = d - s$ |
| $o_t = n(d-s) = no$ | $o_t = (n-1)(d-s) = (n-1)o$ |

Figure 5A:
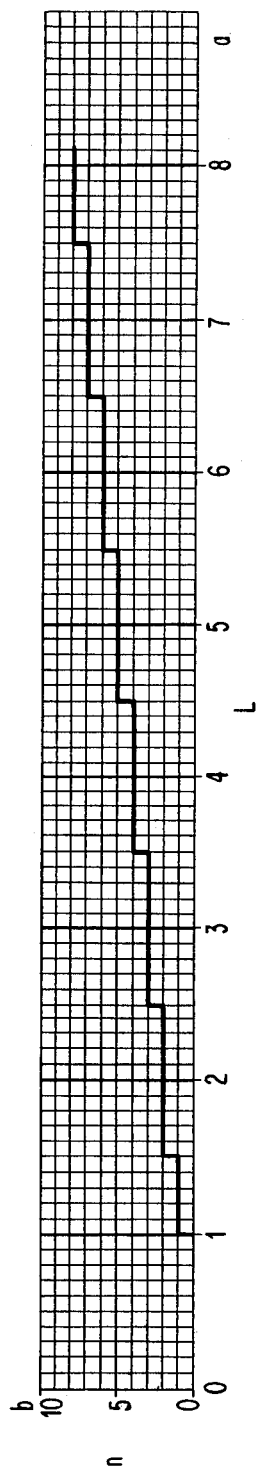
FIGS. 5a, 5b and 5c show graphic representations of $n$ (the number of apertures required to produce an image of length L wherein L is the length of the side of a rectangle to be exposed), $o$ (the length of each individually double exposed region in the direction of L) and $o_t$ (the sum of all the individual lengths $o$ along the length of L) as functions of L, respectively.
Figure 5B:
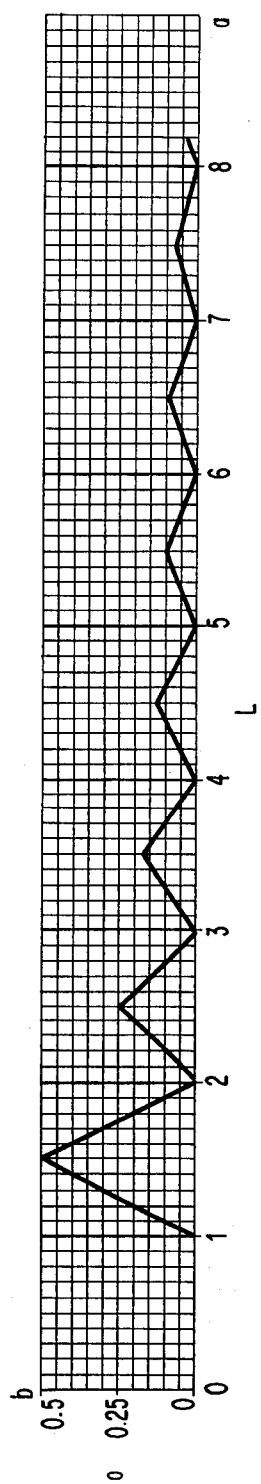
Figure 5C:
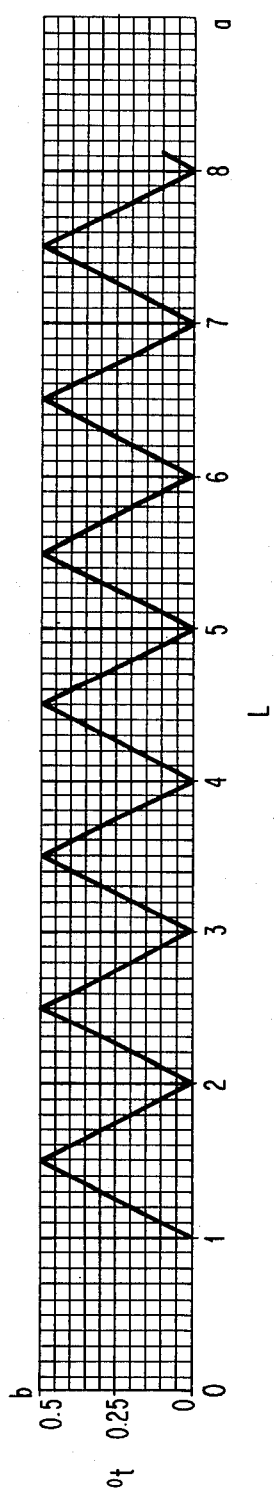

In the foregoing equations:

$\lfloor \ \rfloor$ indicates a number rounded down to the next whole integer $\lceil \ \rceil$ indicates a number rounded up to the next whole integer $L$ = the length of the side of the rectangle to be exposed, wherein $L \geq a$ $n$ = the number of apertures require in the direction of L $s$ = the width of mask material between adjacent apertures $d$ = the length of an aperture side in the direction of L $o$ = the length of each doubly exposed region in the direction of L $o_t$ = the sum of all the $o$'s along the length of L FIGS. 5a through 5c show $n$, $o$ and $o_t$ graphically as functions of L.

Figure 6A:
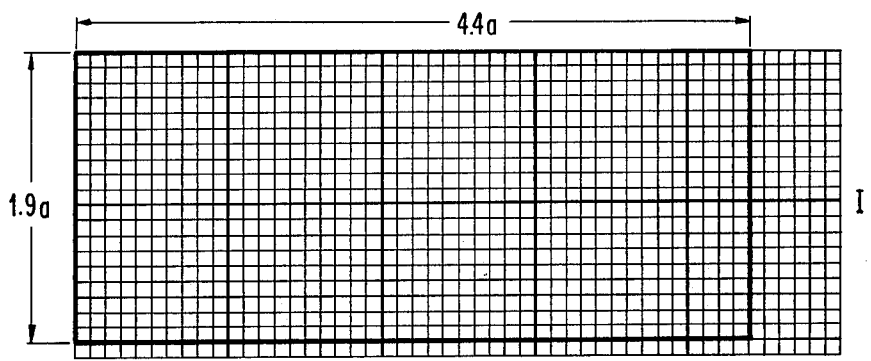
FIGS. 6a, 6b and 6c show a desired synthesized image, the mask aperture arrangement for producing the image and an explanatory development sketch of the synthesized image, respectively.
Figure 6B:
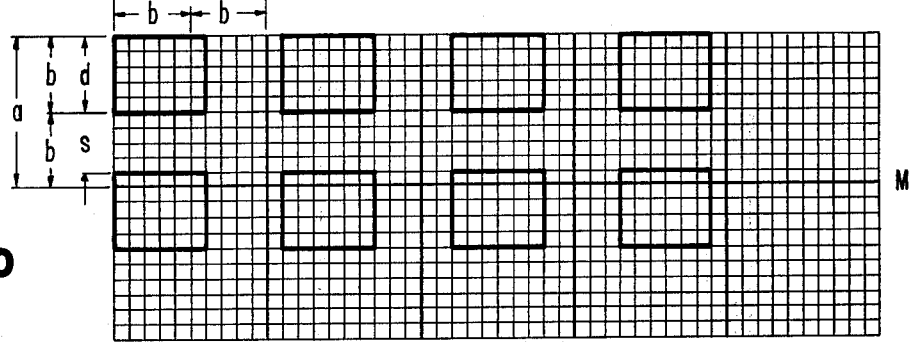

FIG. 6a shows an example wherein an exposure image is desired having a length = $4.4 a$ and a width = $1.9 a$. FIG. 6b shows a preferred mask aperture arrangement for synthesizing the image of FIG. 6a with a minimum amount of double and quadruple exposure. This optimum mask aperture arrangement is derived from the above equations as follows: where $a = 1$ and each square = 0.1:

L (longest side) = 4.4

$(L - \lfloor L \rfloor) = 4.4 - 4 = 0.4$

Figure 6C:
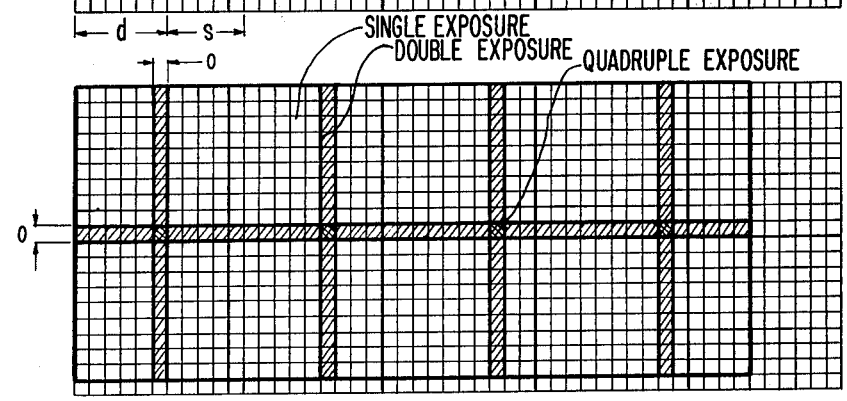

Since 0.4 is less than 0.5, the equations shown under condition 1), apply and:

$n = \lfloor L \rfloor = 4$ $s = b = 0.5$ $d = 0.5 + (4.4 - 4/4) = 0.5 + 0.1 = 0.6$ $o = d - s = 0.6 - 0.5 = 0.1$ $o_t = n(d - s) = 4(0.6 - 0.5) = 0.4$ Thus, it is clear from FIG. 6b that 4 columns of apertures are required each having the longest side 0.6 with a spacing of 0.5 between each aperture. FIG. 6c shows the double exposure caused by each aperture to be $o = 0.1$ and the total double exposure in the direction of the longest side to be $o_t = 0.4$ as calculated. A similar calculation can be made to determine the number, size and spacings of apertures in each column to provide the proper width (i.e., 1.9a) for the rectangle in FIG. 6a. The parameters $n$, $o$, and $o_t$ can be taken directly from the graphs of FIGS. 5a–5c. According to the present scheme all quadruple exposures are "internal", that is, not on an edge. All regions of double exposure have minimum lengths and are uniformly spaced along the edges. The arbitrary image area shown in FIG. 6a is merely exemplary of non-integer areas and the theory can readily be applied to lines or areas whose dimensions are greater than the minimum exposure area $a \times a$, whether integer or non-integer.

As a result of using a plurality of spaced apertures to synthesize an image, masks can be relatively rugged since in extreme cases, the area of a mask will be approximately 80% mask material and 20% apertures.

By using the mask-exposure scheme according to the present invention it is possible to simultaneously synthesize a plurality of images each of which has a different configuration. While known mask exposure schemes permit the simultaneous formation of a plurality of identical images on a base, as for example images used in the fabrication of a plurality of identical circuit components on a wafer, the present invention can simultaneously provide different images which could be used in the fabrication of different circuit components on the same wafer.

FIG. 7a shows two different synthesized images, namely a "T" and an "O", which show a concept analagous to two different circuit images. These two images can be simultaneously synthesized using an apertured mask arrangement such as that shown in FIG. 7b. By using the four step exposure scheme described above with respect to the previous embodiments with a mask as shown in FIG. 7b it will be possible to obtain the two different synthesized images of FIG. 7a simultaneously. Once again the apertures having been laid out on a grid solely for purposes of illustration and images can be formed which are integral or non-integral multiples of the aperture size.

According to the present invention the apertures can be placed anywhere on the mask. All exposures needed in the fabrication of devices do not require full use of the technique proposed herein. For example, exposure of a multiplicity of individual holes would require only a conventional single exposoure and under certain circumstances (i.e., exposure of an array of parallel lines) a two step exposure scheme could be used instead of the four step exposure scheme described above.

Although the present invention has been described specifically with respect to rectilinear images as well as apertures, areas having curved perimeters or straight boundaries which are not parallel to either the X or Y coordinates may be approximated by an aggregate of rectilinear areas.

While the invention has been particularly shown and described with reference to a preferred embodiment thereof it will be understood by those skilled in the art that various changes in form and details may be made therein without departing from the spirit and scope of the invention.

What is claimed is:

1. A method of synthesizing a composite image on a radiation responsive surface consisting passing radiation through a plurality of spaced apart individual rectilinear mask apertures for a given period of time to expose a plurality of first similarly shaped areas on said surface, passing radiation through said apertures during a second period of time and effectively displacing said apertures to expose a second plurality of similarly shaped areas contiguous to said first areas respectively, passing radiation through said apertures during a third period of time and effectively displacing said apertures to expose a plurality of third similarly shaped areas contiguous to said first and second respective areas and passing radiation through said apertures during a fourth period of time and effectively displacing said aperture to expose a plurality of fourth similarly shaped areas contiguous to said first, second and third respective areas said displacing steps defining a rectilinear closed path to define a total exposed rectilinear image and said apertures being so spaced from each other that the synthesized image of each aperture formed by the four step exposure-displacement process described above is contiguous to the adjacent synthesized image to provide a large synthesized rectilinear exposure image on the surface.

2. A method as set forth in claim 1 wherein said radiation is an electron beam and said effective displacement of the apertures is accomplished by a deflection of the electron beam subsequent to passage through the apertures.

3. A method of simultaneously synthesizing at least two separate images, each having a different configuration, on a radiation responsive surface comprising fabricating a mask having at least two distinct exposure areas with each area having a plurality of identical, rectilinear apertures arranged in a different pattern, passing radiation through all of said apertures for a given period of time to expose a first plurality of similarly shaped areas on said surface, passing radiation through all of said apertures during a second time and effectively displacing said apertures to expose a second plurality of similarly shaped areas contiguous to said first area, passing radiation through all of said apertures during a third period of time and effectively displacing said apertures to expose a third plurality of similarly shaped areas contiguous to said first and second areas and passing radiation through all of said apertures during a fourth period of time and effectively displacing said apertures to expose a fourth plurality of similarly shaped areas contiguous to said first, second and third areas to define at least two different composite images, said displacing steps defining a rectilinear closed path.

4. A method as set forth in claim 3 wherein at least one dimension of each of said images is an integral multiple of said aperture size.

5. A method as set forth in claim 3 wherein at least one dimension of each of said images is a non-integral multiple of said aperture size.

6. A method as set forth in claim 3 further comprising fabricating said mask with at least one additional exposure area having a plurality of apertures in a pattern similar to one of said other patterns.

7. A method as set forth in claim 3 wherein said apertures are rectangular and identical to each other.

* * * * *